(12) United States Patent
Lee

(10) Patent No.: US 10,615,200 B2
(45) Date of Patent: Apr. 7, 2020

(54) IMAGE SENSOR AND METHOD OF FABRICATING THE SAME

(71) Applicant: Samsung Electronics Co., Ltd., Suwon-si, Gyeonggi-do (KR)

(72) Inventor: Changkeun Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 51 days.

(21) Appl. No.: 15/994,100

(22) Filed: May 31, 2018

(65) Prior Publication Data

US 2019/0148427 A1  May 16, 2019

(30) Foreign Application Priority Data

Nov. 13, 2017 (KR) .................. 10-2017-0150692

(51) Int. Cl.
*H01L 27/146* (2006.01)
*H01L 21/768* (2006.01)
*H01L 23/48* (2006.01)

(52) U.S. Cl.
CPC .. *H01L 27/14605* (2013.01); *H01L 21/76898* (2013.01); *H01L 23/481* (2013.01); *H01L 27/1463* (2013.01); *H01L 27/1464* (2013.01); *H01L 27/14603* (2013.01); *H01L 27/14607* (2013.01); *H01L 27/14636* (2013.01); *H01L 27/14641* (2013.01); *H01L 27/14689* (2013.01); *H01L 27/14643* (2013.01)

(58) Field of Classification Search
CPC ......... H01L 27/14636; H01L 27/14643; H01L 23/481; H01L 27/14603; H01L 21/76898; H01L 27/1463
See application file for complete search history.

(56) References Cited

U.S. PATENT DOCUMENTS

| | | | |
|---|---|---|---|
| 9,461,084 B2 | 10/2016 | Lee et al. | |
| 9,466,629 B2 | 10/2016 | Yoon et al. | |
| 9,520,435 B2 | 12/2016 | Ahmed et al. | |
| 9,608,026 B2 | 3/2017 | Park et al. | |
| 2011/0233702 A1* | 9/2011 | Takahashi | H01L 27/14645 257/432 |
| 2013/0320479 A1 | 12/2013 | Ahn et al. | |
| 2013/0321680 A1* | 12/2013 | Kumano | H01L 27/14634 348/273 |
| 2016/0118422 A1 | 4/2016 | Takeda | |
| 2016/0343752 A1 | 11/2016 | Tsai et al. | |
| 2017/0047373 A1 | 2/2017 | Peng et al. | |
| 2017/0092684 A1 | 3/2017 | Chang et al. | |

(Continued)

*Primary Examiner* — Ngan V Ngo
(74) *Attorney, Agent, or Firm* — Myers Bigel, P.A.

(57) ABSTRACT

Disclosed are image sensors and methods of fabricating the same. The image sensor includes a semiconductor substrate including a pixel zone and a pad zone and having a first surface and a second surface opposing each other, a first pad separation pattern on the pad zone and extending from the first surface of the semiconductor substrate toward the second surface of the semiconductor substrate, a second pad separation pattern extending from the second surface toward the first surface of the semiconductor substrate on the pad zone the second pad and in contact with the first pad separation pattern, and a pixel separation pattern on the pixel zone and extending from the second surface of the semiconductor substrate toward the first surface of the semiconductor substrate.

20 Claims, 16 Drawing Sheets

(56) References Cited

U.S. PATENT DOCUMENTS

| | | |
|---|---|---|
| 2017/0110526 A1* | 4/2017 | Eo ..................... H01L 27/3258 |
| 2017/0117309 A1 | 4/2017 | Chen et al. |
| 2017/0141145 A1 | 5/2017 | Yamashita et al. |
| 2018/0269133 A1* | 9/2018 | Kume ................... H01L 23/481 |
| 2018/0286782 A1* | 10/2018 | Noda .................... H01L 23/481 |
| 2019/0267433 A1* | 8/2019 | An ...................... H01L 27/3248 |

* cited by examiner

IMAGE SENSOR AND METHOD OF FABRICATING THE SAME

CROSS-REFERENCE TO RELATED APPLICATIONS

This U.S. non-provisional patent application claims priority under 35 U.S.C § 119 of Korean Patent Application No. 10-2017-0150692 filed on Nov. 13, 2017, in the Korean Intellectual Property Office, the disclosure of which is incorporated herein in its entirety by reference.

BACKGROUND

An image sensor transforms optical images into electrical signals. The image sensor may be classified into a charge coupled device (CCD) type or a complementary metal oxide semiconductor (CMOS) type. A CIS (CMOS image sensor) is a CMOS type image sensor. The CIS may include a plurality of two-dimensionally arranged pixels. Each of the pixels includes a photodiode (PD). The photodiode serves to transform incident light into an electrical signal.

SUMMARY

Some embodiments of inventive concepts provide a highly reliable image sensor and a method of fabricating the same.

According to some embodiments of inventive concepts, an image sensor may include a semiconductor substrate including a pixel zone and a pad zone and having a first surface and a second surface opposing each other, a first pad separation pattern on the pad zone and extending from the first surface toward the second surface of the semiconductor substrate, a second pad separation pattern on the pad zone and extending from the second surface toward the first surface of the semiconductor substrate, the second pad separation pattern being in contact with the first pad separation pattern, and a pixel separation pattern on the pixel zone and extending from the second surface toward the first surface.

According to some embodiments of inventive concepts, an image sensor may include a semiconductor substrate including a pad zone and having a first surface and a second surface opposing each other, a first pad separation pattern on the pad zone and extending from the first surface of the semiconductor substrate toward the second surface of the semiconductor substrate; a second pad separation pattern on the pad zone and extending from the second surface of the semiconductor substrate toward the first surface of the semiconductor substrate, the second pad separation pattern being in contact with the first pad separation pattern, and a through via on the pad zone and spaced apart from the first and second pad separation patterns, the through via penetrating the semiconductor substrate. The first pad separation pattern may be disposed in a trench provided in the semiconductor substrate. The trench may be adjacent to the first surface. The first pad separation pattern may include a liner insulation pattern covering an internal surface of the trench, and a buried insulation pattern filling the trench.

According to some embodiments of inventive concepts, a method of fabricating an image sensor may including providing a semiconductor substrate comprising a pad zone and a pixel zone and having a first surface and a second surface opposing each other, forming on the pad zone a first pad separation pattern in the semiconductor substrate, the first pad separation pattern being adjacent to the first surface of the semiconductor substrate, and etching the second surface of the semiconductor substrate to form on the pad zone a first trench exposing the first pad separation pattern and to form a second trench on the pixel zone.

DETAILED DESCRIPTION OF EMBODIMENTS

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

Hereinafter, some embodiments of inventive concepts will be described in detail in conjunction with the accompanying drawings to aid in clearly understanding inventive concepts.

Figure 1:
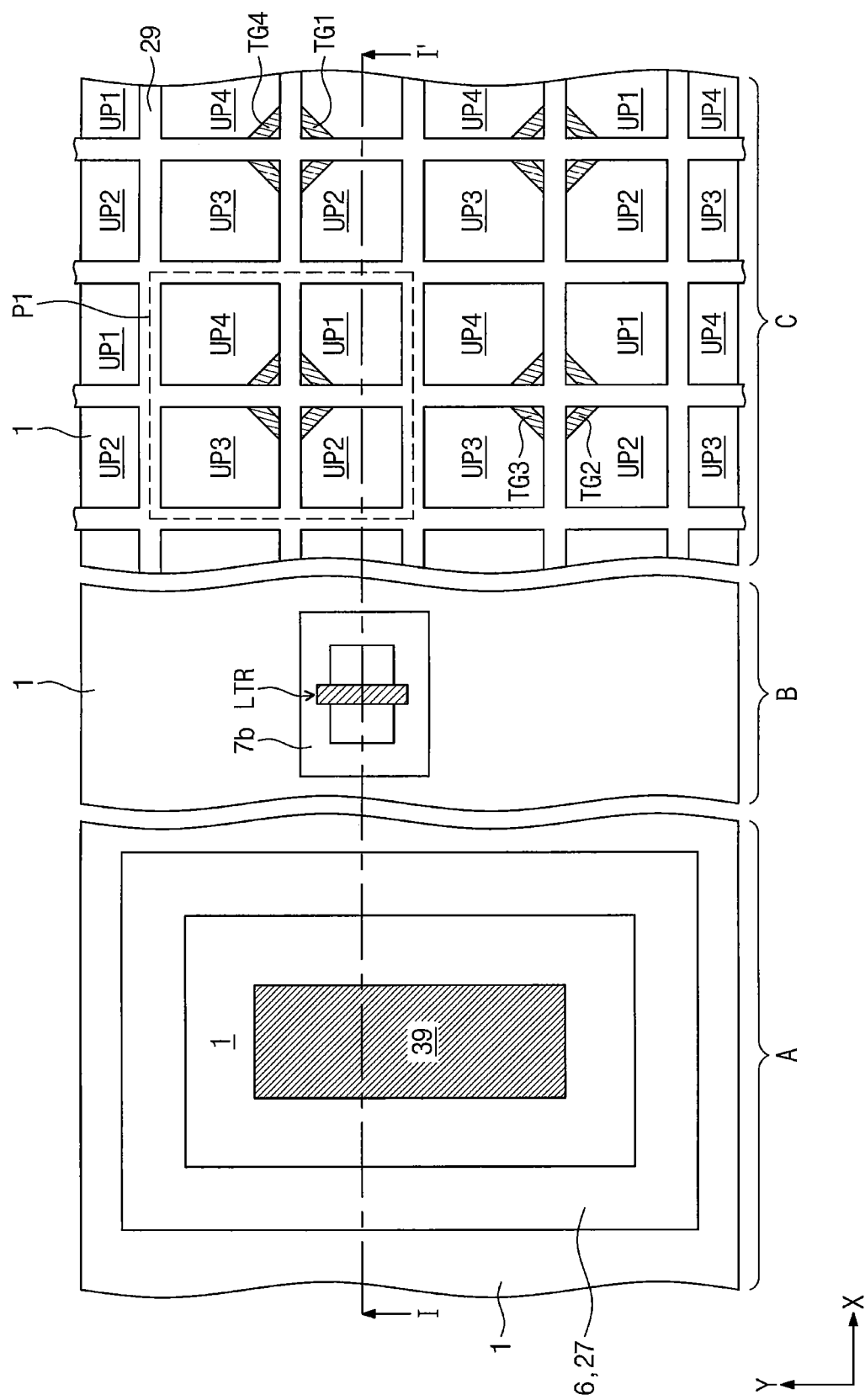
FIG. 1 illustrates a plan view showing an image sensor according to example embodiments of the present inventive concept.
Figure 2:
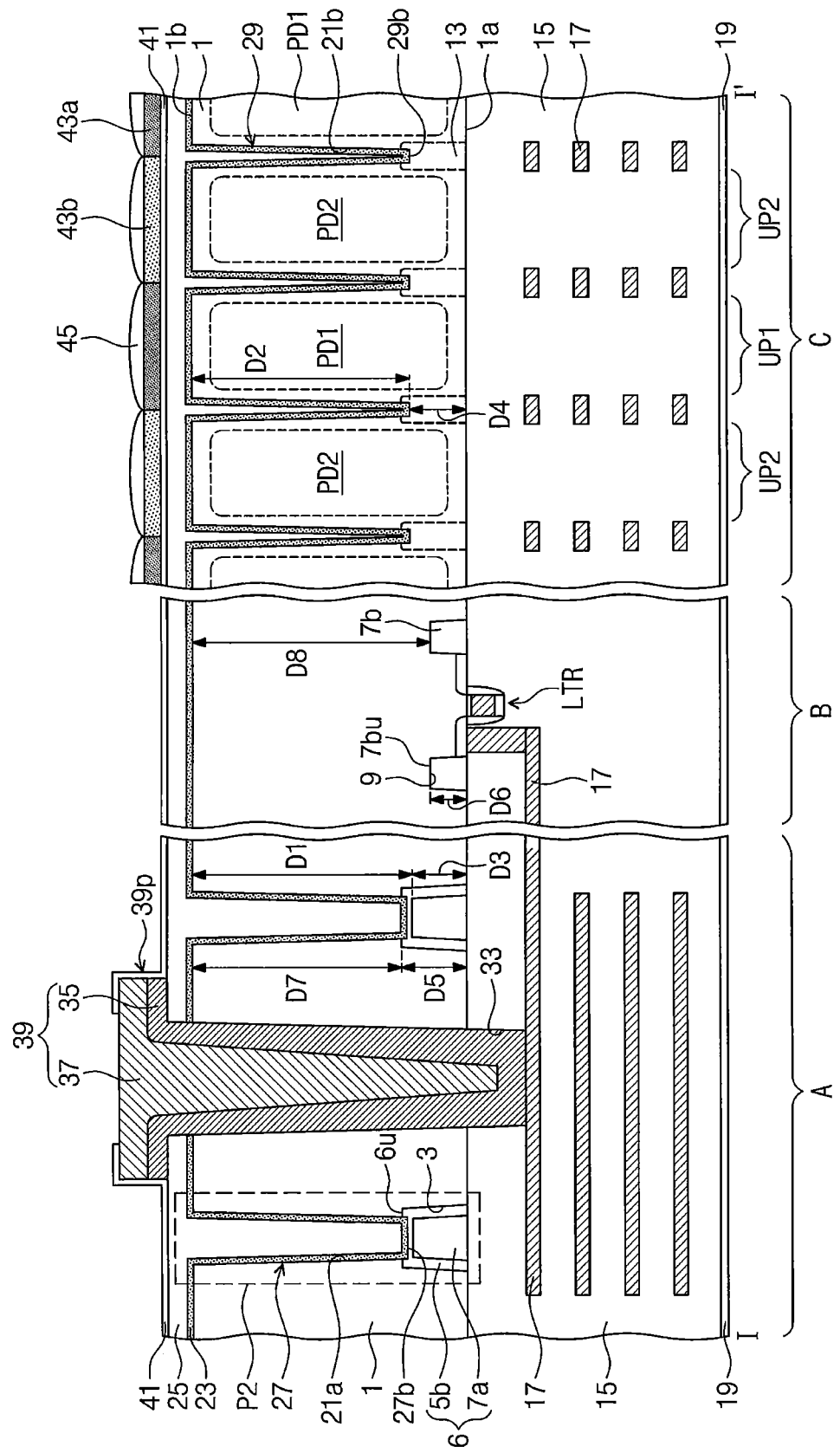
FIG. 2 illustrates a cross-sectional view taken along line I-I' of FIG. 1 according to example embodiments of the present inventive concept.

FIG. 1 illustrates a plan view showing an image sensor according to some embodiments of inventive concepts. FIG. 2 illustrates a cross-sectional view taken along line I-I' of FIG. 1.

Referring to FIGS. 1 and 2, a semiconductor substrate 1 including a pad zone A, a logic zone B, and a pixel zone C is illustrated. The semiconductor substrate 1 may have a first surface 1a and a second surface 1b opposing each other. The semiconductor substrate 1 may be doped with, for example, P-type conductivity impurities on the pixel zone C. The pixel zone C may include a plurality of unit pixels UP1, UP2, UP3, and/or UP4. The pixel zone C may be provided thereon with transfer transistors, reset transistors, select transistors, and source follower transistors that transmit charges created by incident light. The logic zone B may be provided thereon with a logic circuit including logic transistors LTR that drive the transistors disposed on the pixel zone C. The pad zone A may be provided thereon with a through via 39 including a pad 39p that provides electricity and/or communicates electrical signals with the logic circuit.

The logic transistors LTR may be disposed on the first surface 1a. The first surface 1a may be covered with an interlayer dielectric layer 15. The interlayer dielectric layer 15 may be formed of a multiple layer including one or more of a silicon oxide layer, a silicon nitride layer, a silicon oxynitride layer, or a porous low-k dielectric layer. The interlayer dielectric layer 15 may be provided therein with conductive lines 17. A bottom surface of the interlayer dielectric layer 15 may be covered with a first passivation layer 19. The first passivation layer 19 may be formed of, for example, a silicon nitride layer and/or a polyimide layer.

On the pad zone A, the semiconductor substrate 1 may be provided therein with a first pad separation trench 3 extending from the first surface 1a toward the second surface 1b. An internal surface of the first pad separation trench 3 may be conformally covered with a liner insulation pattern 5b. The liner insulation pattern 5b may be formed of, for example, a silicon nitride layer. The first pad separation trench 3 may be filled with a first buried insulation pattern 7a. The first buried insulation pattern 7a may be formed of a material, for example, a silicon oxide layer, different from that of the liner insulation pattern 5b. The first buried insulation pattern 7a and the liner insulation pattern 5b may constitute a first pad separation pattern 6. It will be understood that, although the terms first, second, third, etc. may be used herein to describe various elements, elements should not be limited by these terms; rather, these terms are only used to distinguish one element from another element. Thus, a first element discussed below could be termed a second element without departing from the scope of the present inventive concepts.

On the pad zone A, the semiconductor substrate 1 may be provided therein with a second pad separation trench 21a extending from the second surface 1b toward the first surface 1a. An internal surface of the second pad separation trench 21a may be conformally covered with a fixed charge layer 23. The second pad separation trench 21a may be filled with a second buried insulation layer 25. The fixed charge layer 23 may include either a metal oxide layer including oxygen whose amount is less than its stoichiometric ratio or of a metal fluoride layer including fluorine whose amount is less than its stoichiometric ratio. As such, the fixed charge layer 23 may have a negative fixed charge. The fixed charge layer 23 may include at least one of metal oxide and metal fluoride that include at least one metal selected from the group including hafnium (Hf), zirconium (Zr), aluminum (Al), tantalum (Ta), titanium (Ti), yttrium (Y), and lanthanoid. For example, the fixed charge layer 23 may be or include a hafnium oxide layer or an aluminum fluoride layer. Hole accumulation may occur around the fixed charge layer 23. Therefore, dark current and white spot may be effectively reduced due to the hole accumulation around the fixed charge layer 23. The second buried insulation layer 25 may be formed of a material different from that of the fixed charge layer 23. The second buried insulation layer 25 may be formed of, for example, a silicon oxide layer. A second pad separation pattern 27 may be constituted by the fixed charge layer 23 and the second buried insulation layer 25 that are disposed in the second pad separation trench 21a.

The first pad separation pattern 6 and the second pad separation pattern 27 may be formed to surround the through via 39 in a plan view. The first pad separation pattern 6 and the second pad separation pattern 27 may be spaced apart from the through via 39. The semiconductor substrate 1 may be partially interposed between the first pad separation pattern 6 and the through via 39 and between the second pad separation pattern 27 and the through via 39. The fixed charge layer 23 and the second buried insulation layer 25 may extend outward from the second pad separation trench 21a, covering the second surface 1b.

FIGS. 3A to 3D illustrate cross-sectional views showing section P2 of FIG. 2 according to some embodiments of inventive concepts.

Figure 3A:
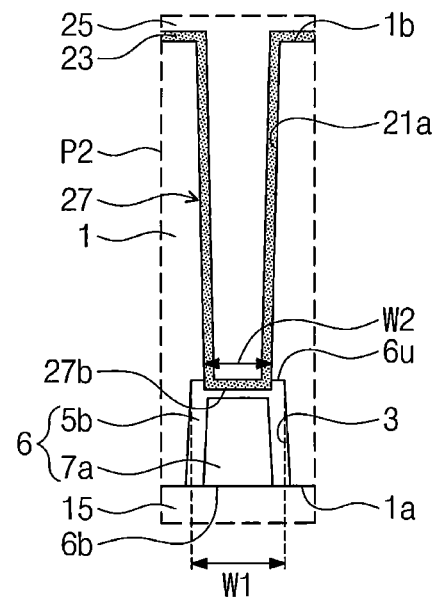
FIGS. 3A to 3D illustrate cross-sectional views showing section P2 of FIG. 2 according to example embodiments of present inventive concept.

Referring to FIG. 3A, the first pad separation pattern 6 may include a top surface 6u opposing and spaced apart from the first surface 1a of the semiconductor substrate 1. The second pad separation pattern 27 may include a bottom surface 27b opposing and spaced apart from the second surface 1b of the semiconductor substrate 1. The top surface 6u of the first pad separation pattern 6 may have a first width W1 greater than a second width W2 of the bottom surface 27b of the second pad separation pattern 27. The bottom surface 27b of the second pad separation pattern 27 may be closer than the top surface 6u of the first pad separation pattern 6 to the first surface 1a. For example, a portion of the second pad separation pattern 27 may be inserted into the first pad separation pattern 6. The first pad separation pattern 6 may have a bottom surface 6b coplanar with the first surface 1a.

Figure 3B:
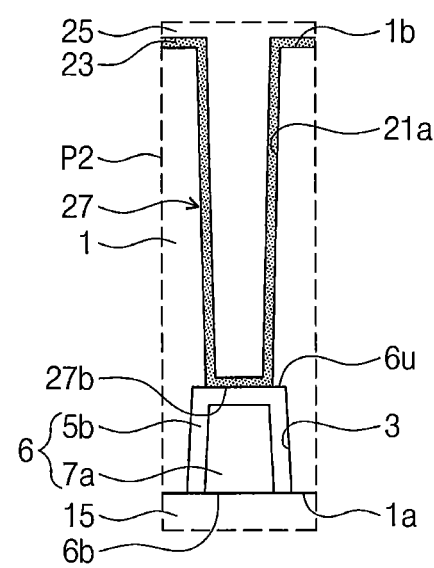

Referring to FIG. 3B, according to some embodiments, the bottom surface 27b of the second pad separation pattern 27 may be located at the same level as that of the top surface 6u of the first pad separation pattern 6. The top surface 6u of the first pad separation pattern 6 may have a width greater than that of the bottom surface 27b of the second pad separation pattern 27.

Figure 3C:
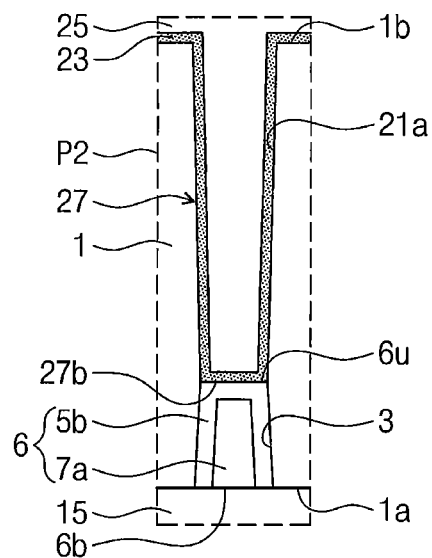

Dissimilarly, referring to FIG. 3C, the bottom surface 27b of the second pad separation pattern 27 may be located at the same level as that of the top surface 6u of the first pad separation pattern 6. The top surface 6u of the first pad separation pattern 6 may have the same width as that of the bottom surface 27b of the second pad separation pattern 27.

Figure 3D:
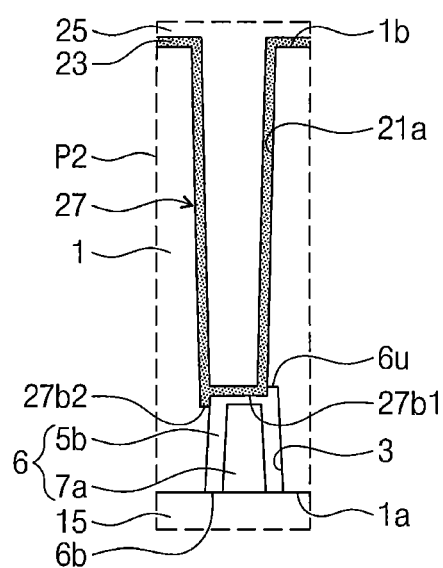

In some embodiments, referring to FIG. 3D, one side of the lower end of the second pad separation pattern 27 may laterally protrude from the first pad separation pattern 6. One side of the upper end of the first pad separation pattern 6 may laterally protrude from the second pad separation pattern 27. The protruding direction of the one side lower end of the second pad separation pattern 27 may be opposite to the protruding direction of the one side upper end of the first pad separation pattern 6. The second pad separation pattern 27 may include a first bottom surface 27b1 in contact with the first pad separation pattern 6 and a second bottom surface 27b2 laterally protruding from the first pad separation pattern 6. The second bottom surface 27b2 may be closer than the first bottom surface 27b1 to the first surface 1a of the semiconductor substrate 1.

Referring back to FIGS. 1 and 2, the through via 39 may be disposed in a through via hole 33 penetrating the second buried insulation layer 25, the fixed charge layer 23, the semiconductor substrate 1, and a portion of the interlayer dielectric layer 15. The through via 39 may be coupled to one of the conductive lines 17. The through via 39 may include a first metal layer 35 and a second metal layer 37 different from each other. The first metal layer 35 may have an electrical resistance less than that of the second metal layer 37. The second metal layer 37 may exhibit superior gap-fill characteristics to those of the first metal layer 35. The first metal layer 35 may be or may include, for example, tungsten. The second metal layer 37 may be or may include, for example, aluminum. The pad 39p may protrude outward from the second buried insulation layer 25. The pad 39p may have a width greater than that of the through via 39 disposed in the through via hole 33.

The pixel zone C may be provided thereon with a pixel separation pattern 29 that separates the unit pixels UP1, UP2, UP3, and UP4 from each other. The pixel separation pattern 29 may have a network shape in a plan view. The pixel separation pattern 29 may be disposed in a pixel separation trench 21b extending from the second surface 1b toward the first surface 1a. The pixel separation pattern 29 may include the fixed charge layer 23 and the second buried insulation layer 25. The fixed charge layer 23 may extend from the second surface 1b and conformally cover an internal surface of the pixel separation trench 21b. The second buried insulation layer 25 may fill the pixel separation trench 21b. The pixel separation pattern 29 may be spaced apart from the first surface 1a. A pixel separation region 13 may be disposed between the first surface 1a and the pixel separation pattern 29. The pixel separation region 13 may be or may include an impurity-doped region that is doped with impurities having the same conductivity, for example, P-type conductivity, as that of the impurities doped in the semiconductor substrate 1. An impurity concentration of the pixel separation region 13 may be greater than that of the semiconductor substrate 1. The pixel separation region 13 may be disposed adjacent to the first surface 1a, and may serve as a device isolation layer defining an active region. The pixel separation trench 21b may not be formed to reach the first surface 1a, and the pixel separation region 13 may be disposed, thereby reducing dark current. A first distance D1 between the second surface 1b and the bottom surface 27b of the second pad separation pattern 27 may be identical to or less than a second distance D2 between the second surface 1b and a bottom surface 29b of the pixel separation pattern 29. For example, a third distance D3 from the first surface 1a to the second pad separation pattern 27 may be identical to or greater than a fourth distance D4 from the first surface 1a to the pixel separation pattern 29. A distance from the second surface 1b of the semiconductor substrate 1 to the pixel separation region 13 may be substantially the same as a distance from the second surface 1b of the semiconductor substrate 1 to the first pad separation pattern 6.

The logic zone B may be provided thereon with a logic separation pattern 7b defining an active region of the logic transistor LTR. The logic separation pattern 7b may be disposed in a logic separation trench 9 extending from the first surface 1a toward the second surface 1b. The logic separation pattern 7b may be formed of the same material as that of the first buried insulation pattern 7a. A fifth distance D5 between the first surface 1a and the top surface 6u of the first pad separation pattern 6 may be greater than a sixth distance D6 between the first surface 1a and a top surface 7bu of the logic separation pattern 7b. For example, the fifth distance D5 may be about twice the sixth distance D6. In this sense, a seventh distance D7 from the second surface 1b to the first pad separation pattern 6 may be less than an eighth distance D8 from the second surface 1b to the logic separation pattern 7b.

Figure 4:
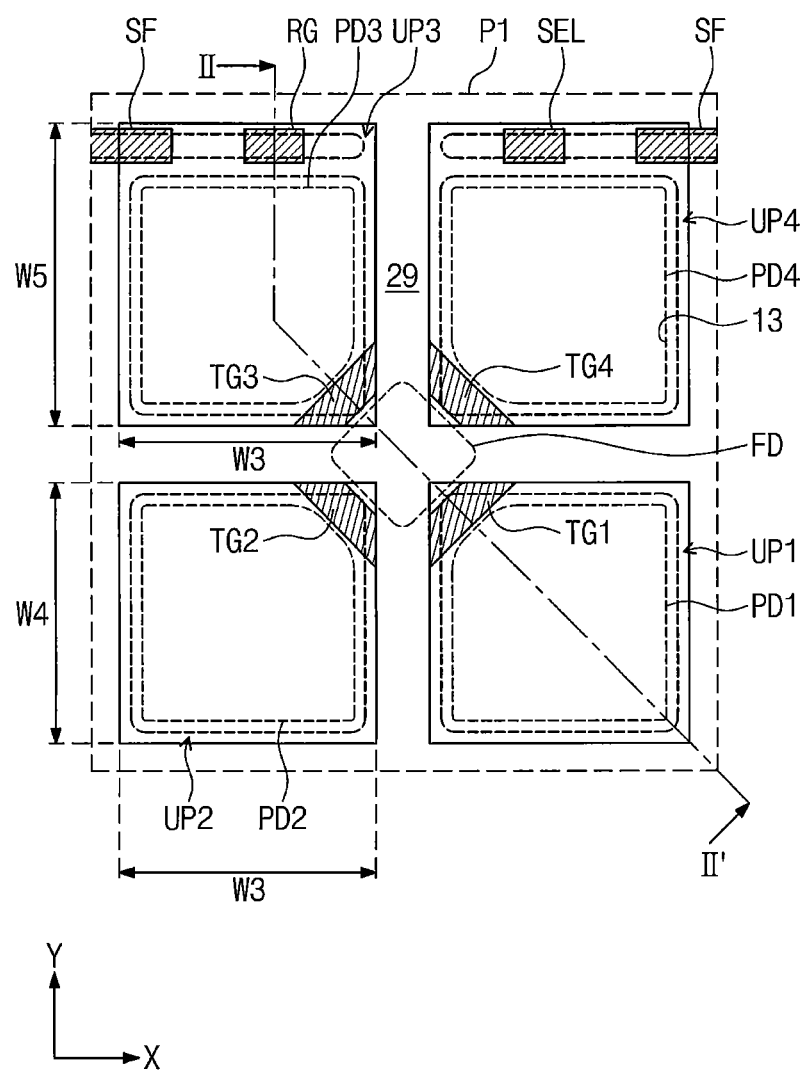
FIG. 4 illustrates an enlarged view showing section P1 of FIG. 1 according to example embodiments of the present inventive concept.
Figure 5:
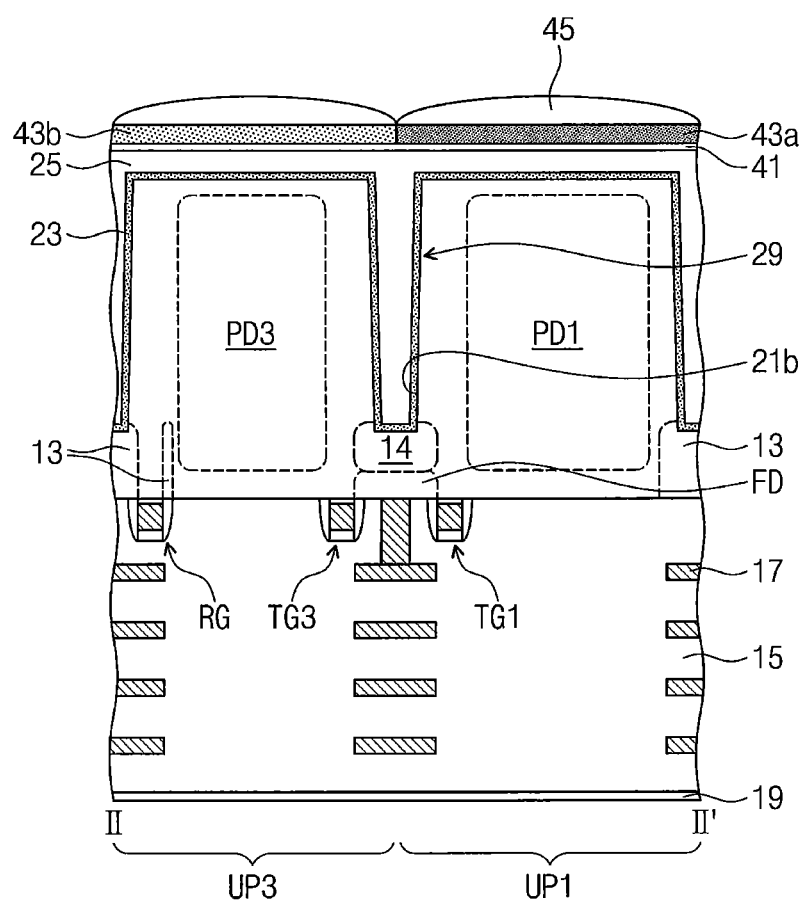
FIG. 5 illustrates a cross-sectional view taken along line II-II' of FIG. 4 according to example embodiments of the present inventive concept.
Figure 6:
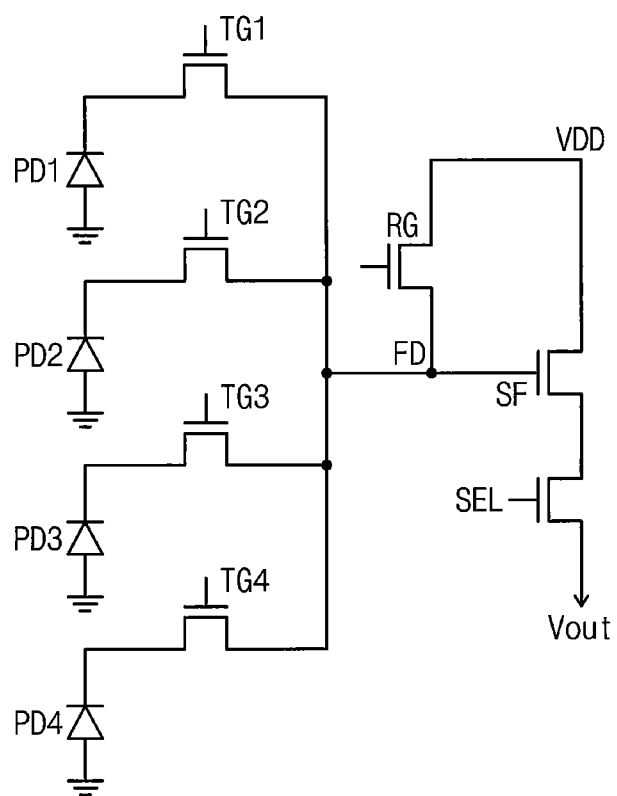
FIG. 6 illustrates a circuit diagram showing an image sensor according to example embodiments of the present inventive concept.

FIG. 4 illustrates an enlarged view showing section P1 of FIG. 1. FIG. 5 illustrates a cross-sectional view taken along line II-II' of FIG. 4. FIG. 6 is a circuit diagram illustrating an image sensor according to some embodiments of the present inventive concept.

Referring to FIGS. 1, 2, 4, 5, and 6, the unit pixels UP1, UP2, UP3, and UP4 may include a first unit pixel UP1, a second unit pixel UP2, a third unit pixel UP3, and a fourth unit pixel UP4 that are adjacent to each other. The first unit pixel UP1, the second unit pixel UP2, the third unit pixel UP3, and the fourth unit pixel UP4 may share a single floating diffusion region FD. The first unit pixel UP1 may include a first transfer gate TG1 and a first photoelectric conversion part PD1 that is disposed in the semiconductor substrate 1. For example, the first unit pixel UP1 may have the first transfer gate TG1 at its corner adjacent to the second, third, and fourth unit pixels UP2, UP3, and UP4. The second unit pixel UP2 may include a second transfer gate TG2 and a second photoelectric conversion part PD2 that is disposed in the semiconductor substrate 1. For example, the second unit pixel UP2 may have the second transfer gate TG2 at its corner adjacent to the first, third, and fourth unit pixels UP1, UP3, and UP4. Each of the first and second unit pixels UP1 and UP2 may have a third width W3 parallel to a first direction X and a fourth width W4 parallel to a second direction Y intersecting the first direction X. The third width W3 may be substantially the same as the fourth width W4.

A reset gate RG, a select gate SEL, and a source follower gate SF may be disposed on the third and fourth unit pixels UP3 and UP4. For example, the third unit pixel UP3 may include a third transfer gate TG3, a third photoelectric conversion part PD3 disposed in the semiconductor substrate 1, the reset gate RG, and a portion of the source follower gate SF. The fourth unit pixel UP4 may include a fourth transfer gate TG4, a fourth photoelectric conversion part PD4 disposed in the semiconductor substrate 1, the select gate SEL, and other portions of the source follower gate SF. In order to secure spaces accommodating the reset gate RG, the select gate SEL, and the source follower gate SF, each of the third and fourth unit pixels UP3 and UP4 may have a fifth width W5 parallel to the second direction Y and greater than the fourth width W4. For example, the pixel separation pattern 29 may have a relatively small length corresponding to the fourth width W4 and a relatively great length corresponding to the fifth width W5. Each of the third and fourth unit pixels UP3 and UP4 may have the third width W3 parallel to the first direction X.

Each of the first to fourth photoelectric conversion parts PD1, PD2, PD3, and PD4 may include an impurity-doped region that is doped with impurities having an opposite conductivity, for example, N-type conductivity, to that of the impurities doped in the semiconductor substrate 1. A PN junction may be formed by the N-type conductivity doped region and the P-type conductivity doped region in the semiconductor substrate 1, creating electron-hole pairs when light is incident.

The floating diffusion region FD may be doped with impurities having an opposite conductivity, for example, N-type conductivity, to that of the impurities doped in the semiconductor substrate 1. The pixel separation pattern 29 may be disposed beneath the floating diffusion region FD. An auxiliary pixel separation region 14 may be disposed between the pixel separation pattern 29 and the floating diffusion region FD. The auxiliary pixel separation region 14 may be doped with the same impurities at the same concentration as that of the pixel separation region 13. For example, on the third unit pixel UP3, the pixel separation region 13 may be interposed between the third photoelectric conversion part PD3 and a channel region beneath the reset gate RG, such that charges generated in the third photoelectric conversion part PD3 may be prevented from flowing into the channel region beneath the reset gate RG.

Referring to FIGS. 4 and 6, charges created in the first to fourth unit pixels UP1 to UP4 may be sequentially transferred. First, a power voltage VDD may be applied to a drain of reset transistor including the reset gate RG and a drain of source follower transistor including the source follower gate SF, discharging charges remaining in the floating diffusion region FD. Afterwards, the reset transistor may be turned off and the first transfer gate TG1 may be supplied with a voltage, with the result that charges generated in the first photoelectric conversion part PD1 may be transferred to and accumulated in the floating diffusion region FD. A bias of the source follower gate SF may change in proportion to an amount of the accumulated charges, and this may lead to a variation in source potential of the source follower transistor. In this case, when a select transistor including the select gate SEL is turned on, a signal based on accumulated charges may be read out of a signal readout line Vout. Successively, the same operation may be performed on the second to fourth unit pixels UP2 to UP4.

Referring back to FIG. 2, a second passivation layer 41 may be disposed on the second buried insulation layer 25. The second passivation layer 41 may be formed of, for example, a silicon nitride layer or a polyimide layer. The pixel zone C may be provided thereon with color filters 43a and 43b disposed on the second passivation layer 41. For example, each of the color filters 43a and 43b may have one of red, green, and blue colors. Micro-lenses 45 may be disposed on the color filters 43a and 43b. The color filters 43a and 43b and the micro-lenses 45 may be disposed on the second passivation layer 41 on the second surface 1b, or on the first passivation layer 19 on the first surface 1a. On the pad zone A, the second passivation layer 41 may cover a sidewall of the pad 39a and partially expose a top surface of the pad 39p.

FIGS. 7 to 15 illustrate cross-sectional views showing a method of fabricating an image sensor having the cross-section of FIG. 2.

Figure 7:
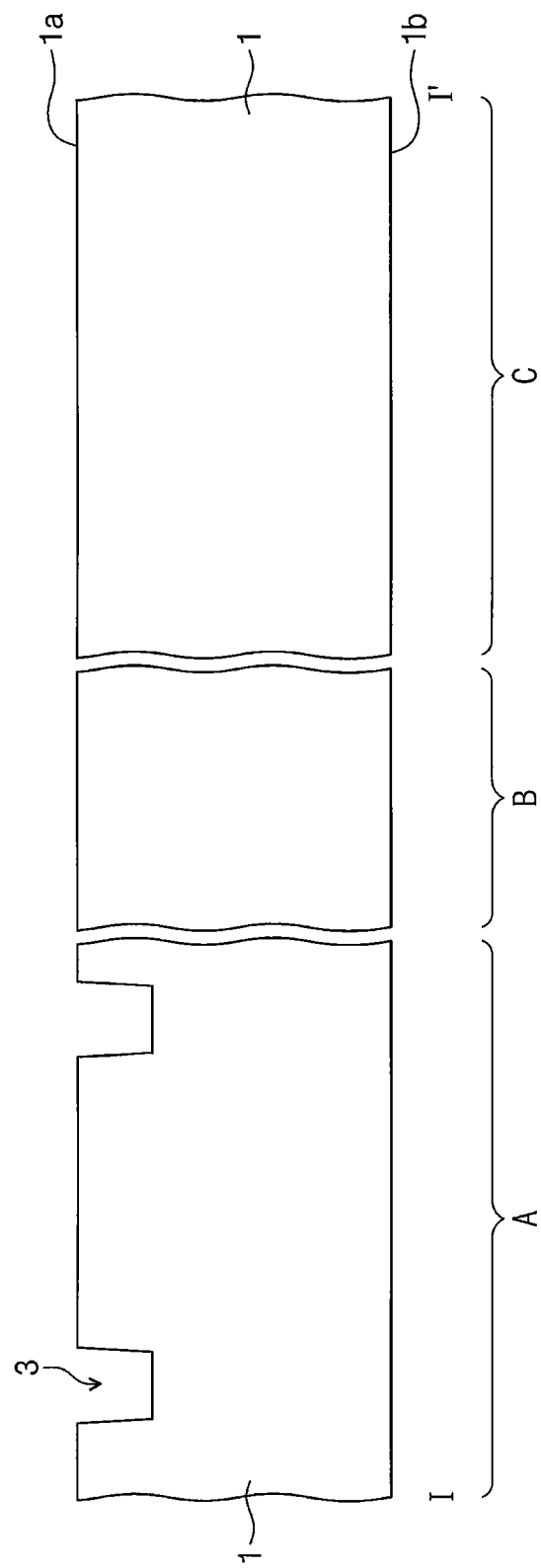
FIGS. 7 to 15 illustrate cross-sectional views showing a method of fabricating an image sensor having the cross-section of FIG. 2 according to example embodiments of the present inventive concept.

Referring to FIG. 7, there may be prepared a semiconductor substrate 1 including a pad zone A, a logic zone B, and a pixel zone C. The semiconductor substrate 1 may have a first surface 1a and a second surface 1b opposing each other. The semiconductor substrate 1 on the pixel zone C may be doped with, for example, P-type conductivity impurities. The first surface 1a of the semiconductor substrate 1 may be etched to form a first pad separation trench 3 on the pad zone A.

Figure 8:
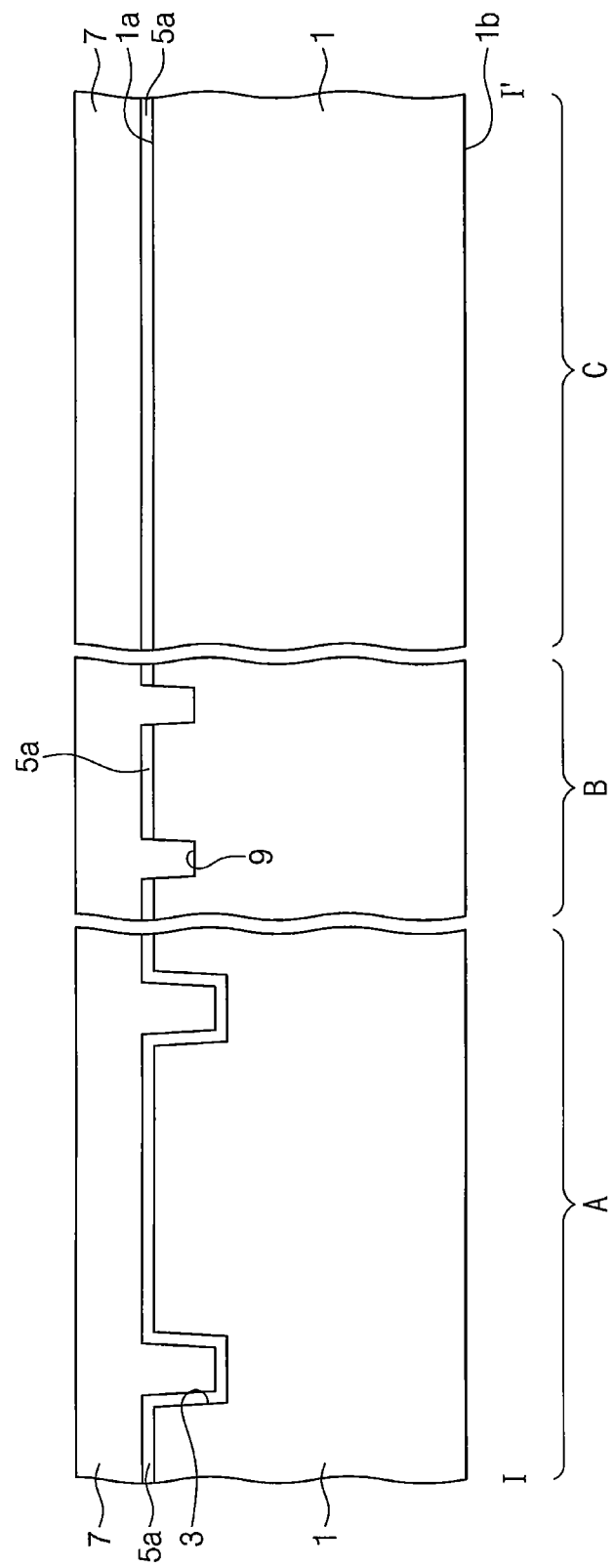

Referring to FIG. 8, a mask layer may be conformally formed on the entirety of the first surface 1a of the semiconductor substrate 1. The mask layer may be or include, for example, a silicon nitride layer. The mask layer may be formed to conformally cover an inner wall of the first pad separation trench 3. The mask layer may not completely fill the first pad separation trench 3. Although not shown, a photoresist pattern may be formed on the mask layer, and then the photoresist pattern may be utilized as an etching mask to pattern the mask layer on the logic zone B, thereby forming a mask pattern 5a defining a logic separation trench 9. The photoresist pattern may be removed. The mask pattern 5a may be utilized as an etching mask to etch the semiconductor substrate 1 on the logic zone B, which may form the logic separation trench 9. The mask pattern 5a may be stacked thereon with a first buried insulation layer 7 filling the logic separation trench 9 and the first pad separation trench 3. The first buried insulation layer 7 may be formed of, for example, a silicon oxide layer.

Figure 9:
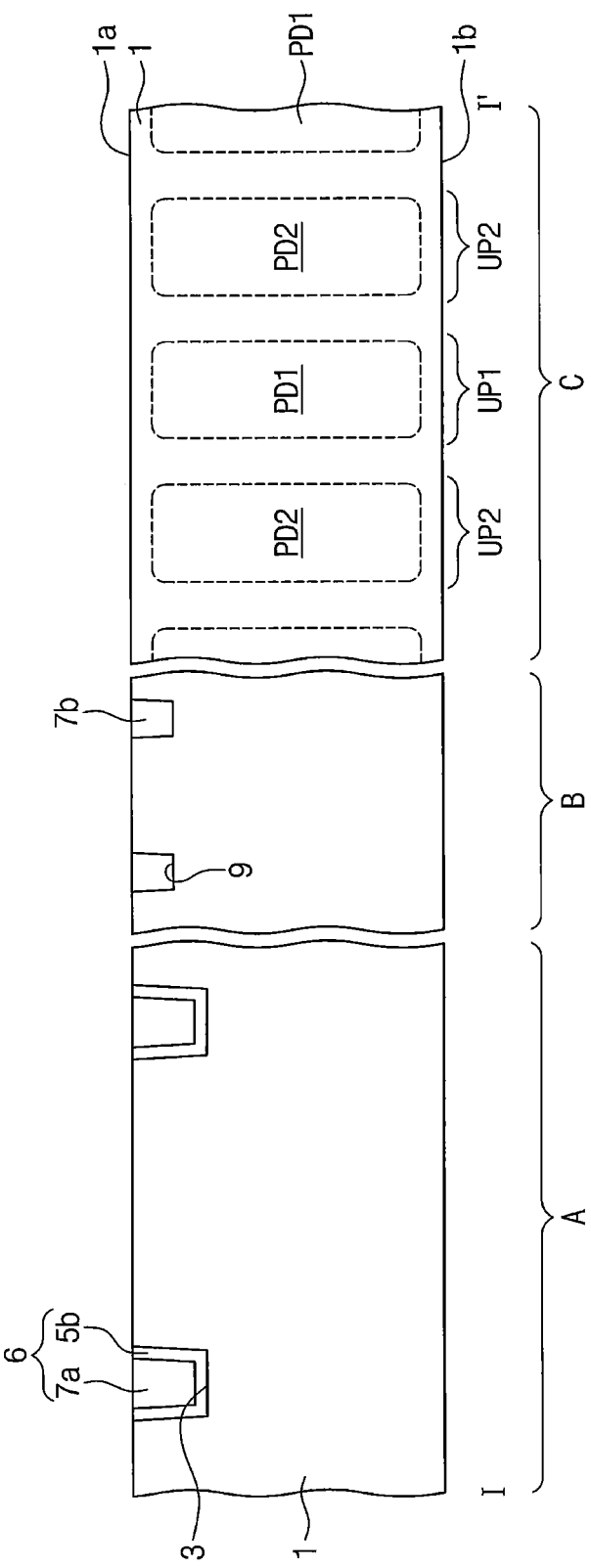

Referring to FIGS. 1, 4, and 9, a planarization etching process such as chemical mechanical polishing (CMP) or etch-back may be performed to remove the first buried insulation layer 7 and the mask pattern 5a on the first surface 1a of the semiconductor substrate 1, thereby forming a logic separation pattern 7b on the logic zone B simultaneously with forming on the pad zone A a first pad separation pattern 6 consisting of a liner insulation pattern 5b and a first buried insulation pattern 7a. An ion implantation process may be performed to form on the pixel zone C first to fourth photoelectric conversion parts PD1, PD2, PD3, and PD4 in first to fourth unit pixels UP1, UP2, UP3, and UP4, respectively.

Figure 10:
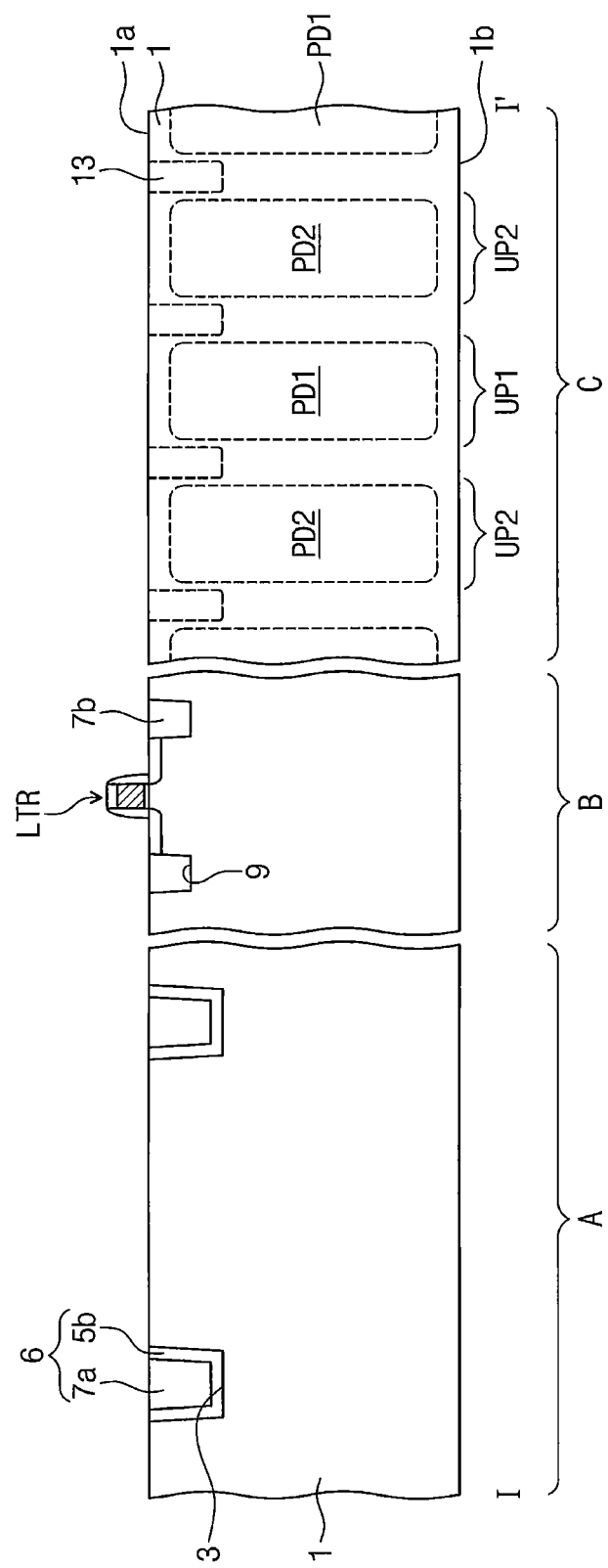

Referring to FIGS. 1, 4, and 10, an ion implantation process may be performed to form a pixel separation region 13 defining an active region on each of the unit pixels UP1 to UP4, and thus the semiconductor substrate 1 may include therein the pixel separation region 13 adjacent to the first surface 1a on the pixel zone C. Transfer gates TG1, TG2, TG3, and TG4, reset gates RG, source follower gates SF, and select gates SEL may be formed on the first surface 1a of the semiconductor substrate 1. An ion implantation process may be performed to form source/drain regions on opposite sides of each of the gates TG, RG, SF, and SEL, and to form a floating diffusion region FD. A logic transistor LTR may also be formed on the logic zone B.

Figure 11:
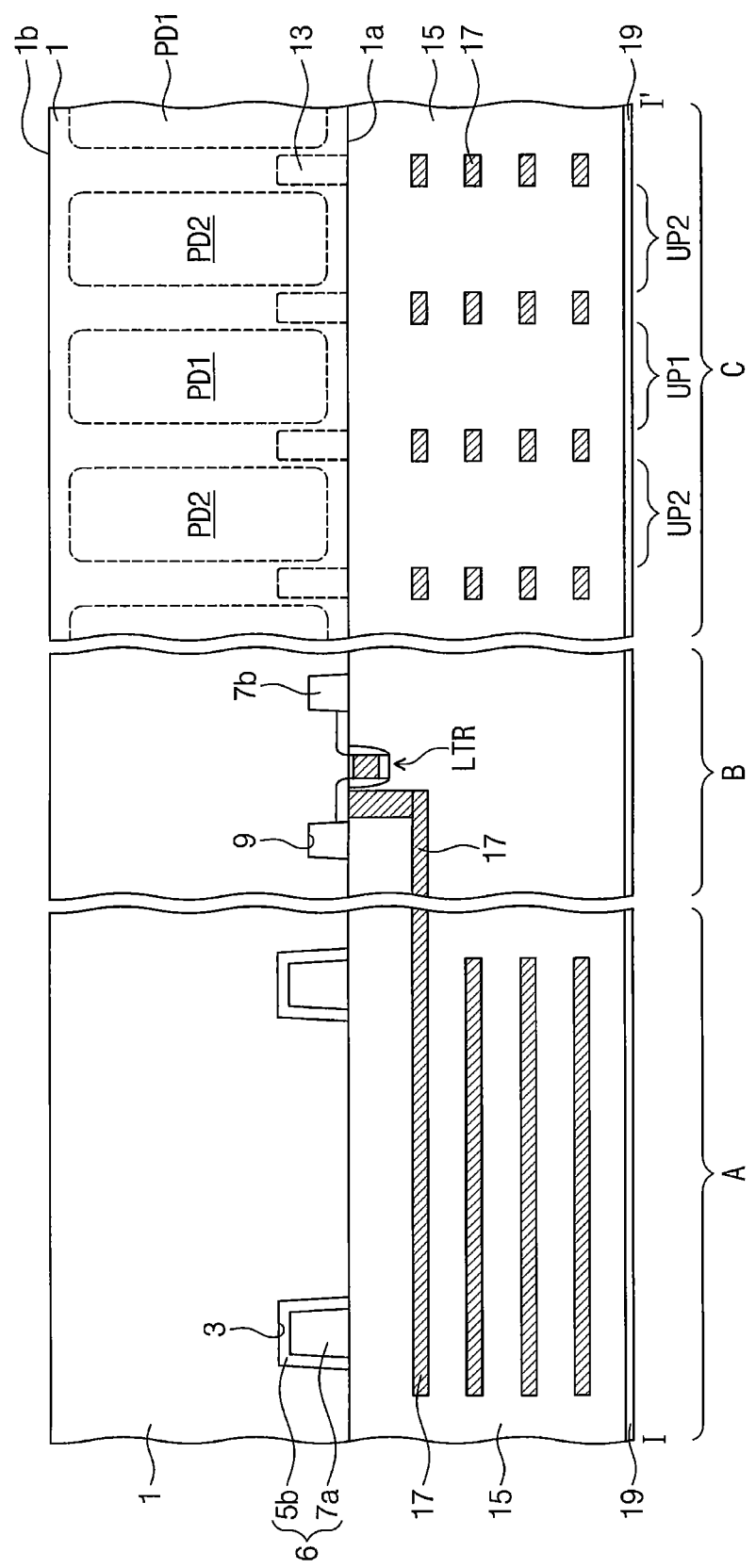

Referring to FIG. 11, an interlayer dielectric layer 15 and conductive lines 17 may be formed on the first surface 1a of the semiconductor substrate 1. A first passivation layer 19 may be formed on the interlayer dielectric layer 15. The semiconductor substrate 1 may be turned upside down to cause the second surface 1b to face upward.

Figure 12:
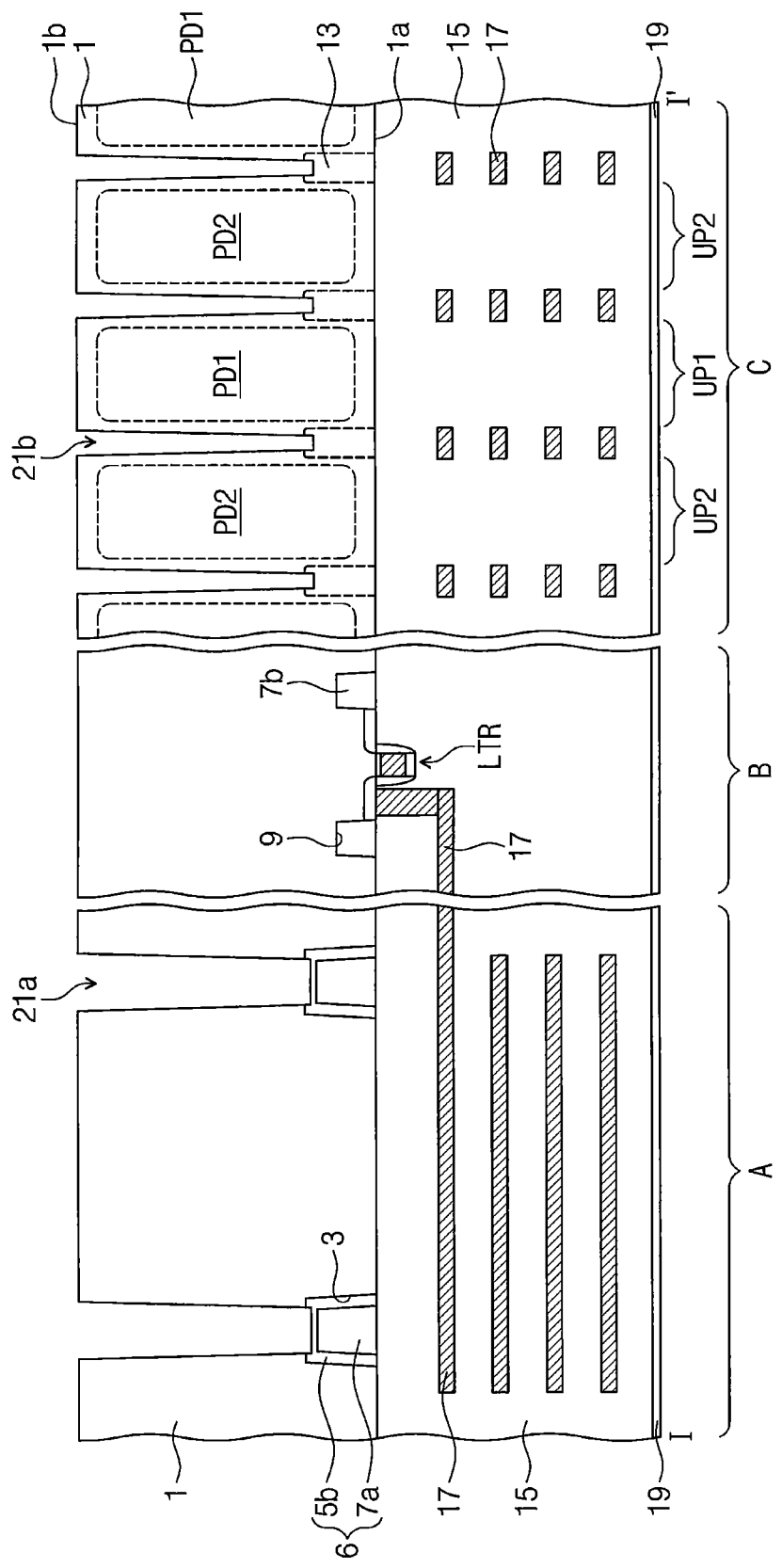

Referring to FIG. 12, an etching process may be performed such that the second surface 1b of the semiconductor substrate 1 may be etched to form on the pad zone A a second pad separation trench 21a exposing the first pad separation pattern 6 and at the same time to form on the pixel zone C a pixel separation trench 21b exposing the pixel separation region 13. The second pad separation trench 21a may be formed to have a width greater than that of the pixel separation trench 21b. When the etching process is performed, the first pad separation pattern 6 may serve as an etch stop layer. Accordingly, the pixel separation trench 21b may be precisely controlled in depth, and an image sensor may be fabricated to have enhanced reliability. When, as illustrated in FIG. 3A, the top surface 6u of the first pad separation pattern 6 is formed to have a first width W1 greater than a second width W2 of the bottom surface 27b of the second pad separation pattern 27, a misalignment may be prevented when the etching process is performed to form the second pad separation trench 21a. As the first pad separation pattern 6 serving as an etch stop layer is not be formed on a floor of the pixel separation trench 21b on the pixel zone C, the pixel separation trench 21b may be formed deeper than the second pad separation trench 21a.

The first pad separation pattern 6 may contribute to forming the second pad separation trench 21a and the pixel separation trench 21b at the same time. When the first pad separation pattern 6 is not formed, it may be necessary that the second pad separation trench 21a be formed much deeper to insulate the semiconductor substrate 1 from a through via (39 of FIG. 15) which will be discussed below. For example, the second pad separation trench 21a may be formed to reach the first surface 1a so as to expose the interlayer dielectric layer 15. In this case, due to difference in etching depth, it may be difficult to form the second pad separation trench 21a and the pixel separation trench 21b at the same time. If one of the second pad separation trench 21a and the pixel separation trench 21b is formed earlier than the other, a required photoresist pattern may remain in one of the second pad separation trench 21a and the pixel separation trench 21b, which may induce process failure. However, according to inventive concepts, since the first pad separation pattern 6 is contributed to the simultaneous formation of the second pad separation trench 21a and the pixel separation trench 21b, such process failure may be prevented.

Figure 13:
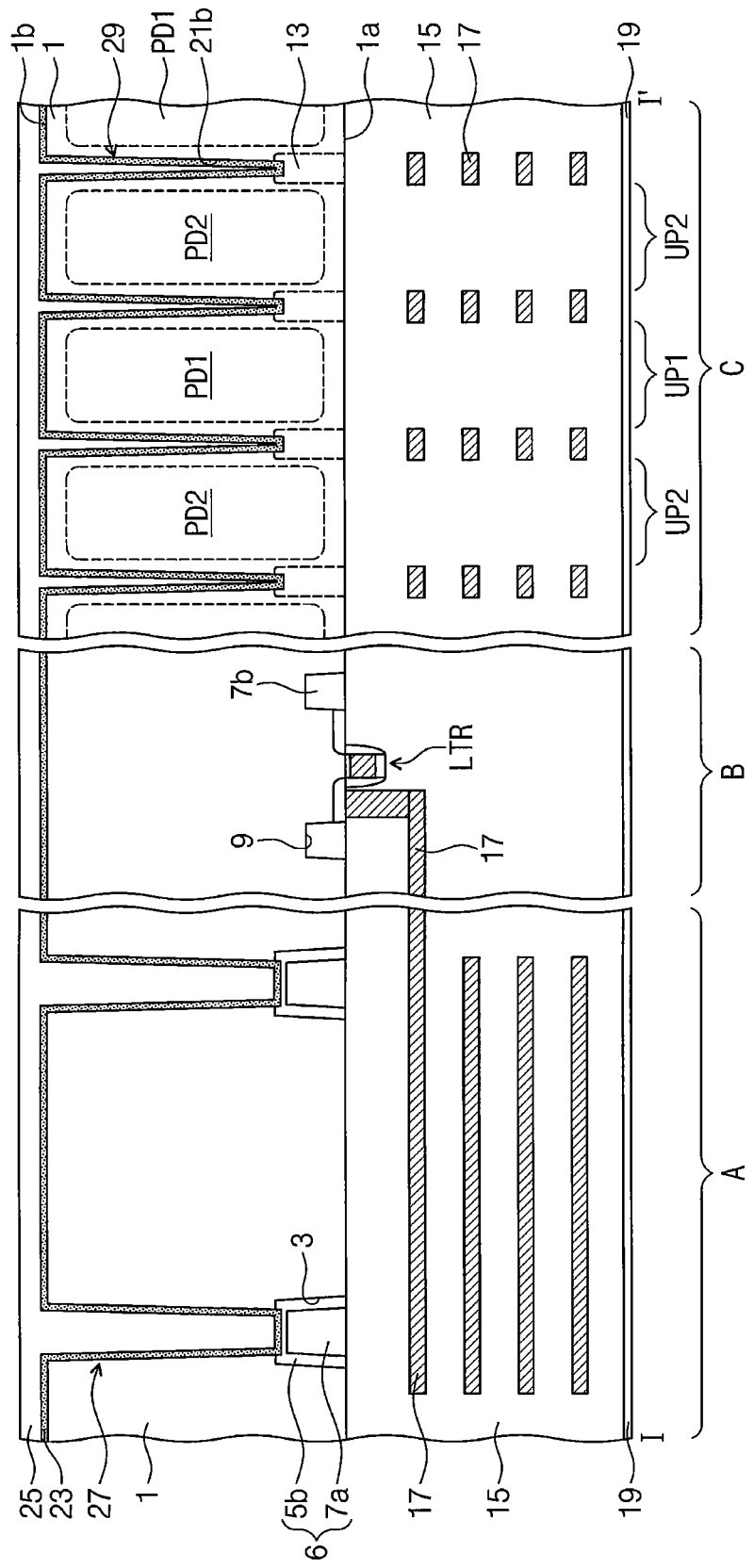

Referring to FIG. 13, a fixed charge layer 23 may be conformally formed on the entirety of the second surface 1b of the semiconductor substrate 1. The fixed charge layer 23 may be stacked thereon with a second buried insulation layer 25 filling the second pad separation trench 21a and the pixel separation trench 21b. Accordingly, a second pad separation pattern 27 may be formed in the second pad separation trench 21a, and at the same time, a pixel separation pattern 29 may be formed in the pixel separation trench 21b. The pixel separation pattern 29 may separate the unit pixels UP1 to UP4 from each other. Although not shown, a planarization etching process may be performed to planarize a top surface of the second buried insulation layer 25.

Figure 14:
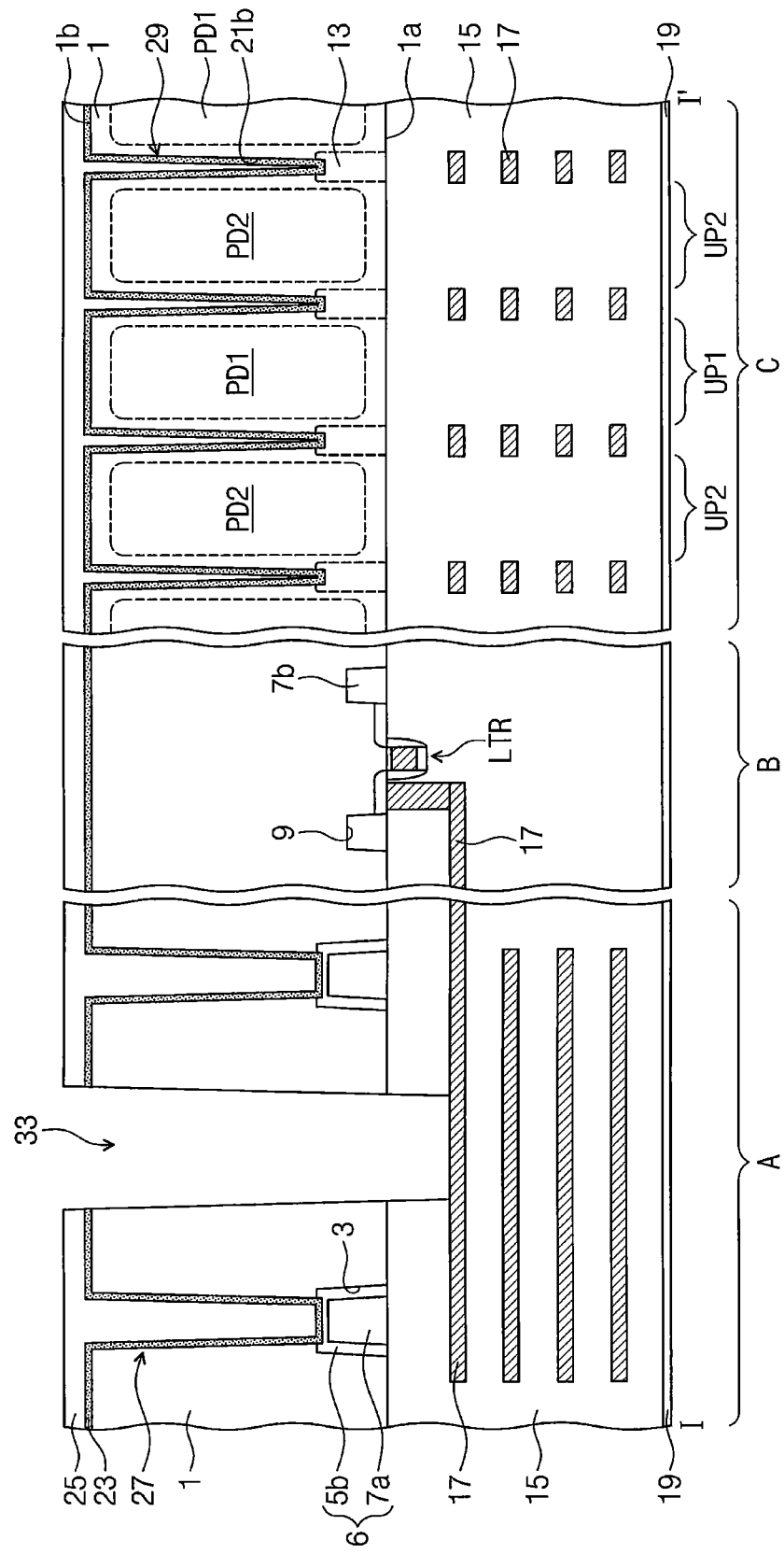

Referring to FIG. 14, on the pad zone A, the second buried insulation layer 25, the fixed charge layer 23, the semiconductor substrate 1, and the interlayer dielectric layer 15 may be patterned to form a through via hole 33 exposing the conductive line 17.

Figure 15:
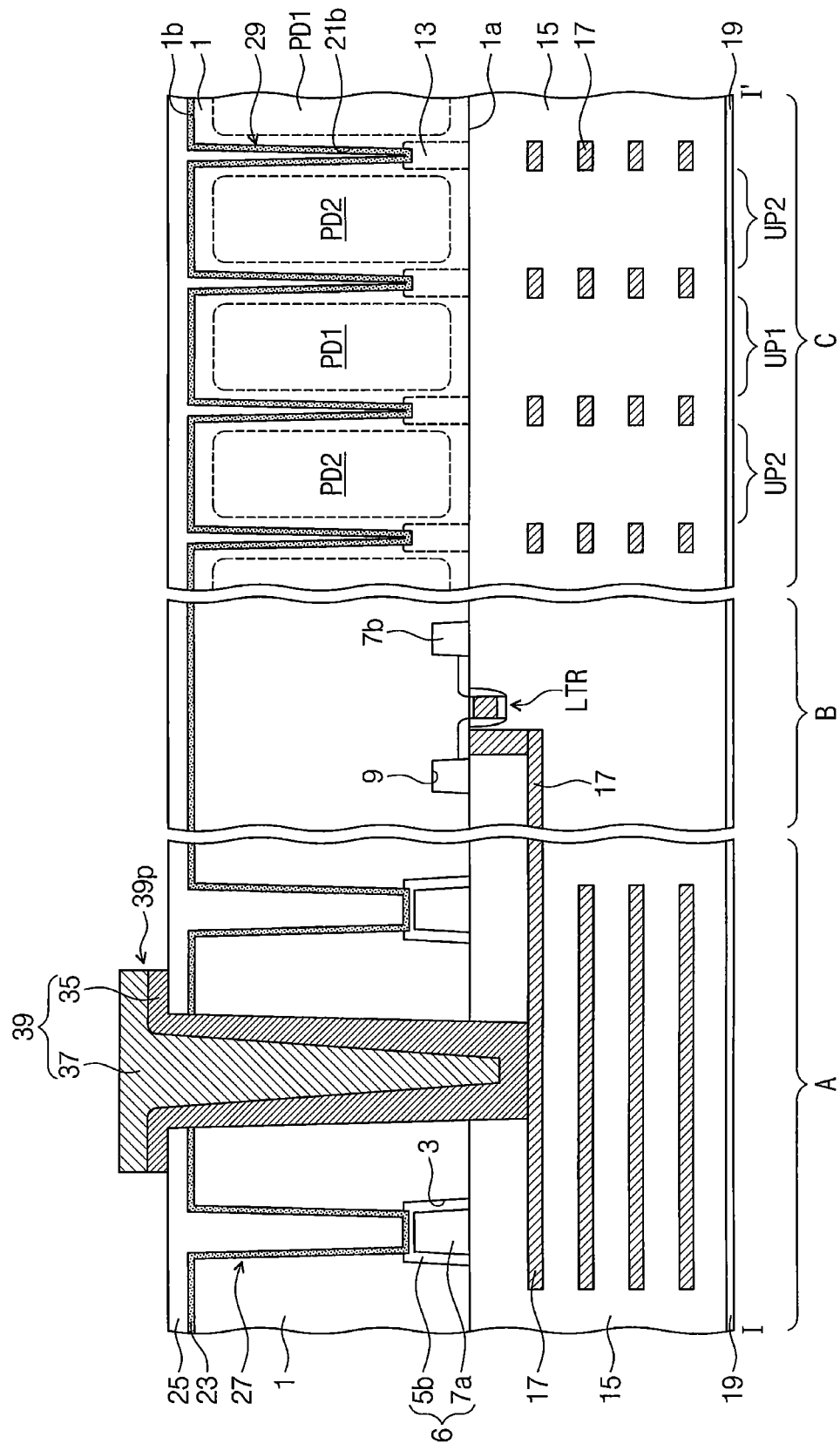

Referring to FIG. 15, a first metal layer 35 may be formed on the entirety of the second surface 1b of the semiconductor substrate 1, covering an internal surface of the through via hole 33. A second metal layer 37 may be formed on the first metal layer 35, filling the through via hole 33. The first metal layer 35 may be or include tungsten, and the second metal layer 37 may be or include aluminum. The second metal layer 37 and the first metal layer 35 may be patterned to form a through via 39 in the through via hole 33 and at the same time to form a pad 39p on the second buried insulation layer 25.

Referring back to FIG. 2, a second passivation layer 41 may be conformally formed on the second surface 1b of the semiconductor substrate 1, and then patterned to expose the pad 39p. On the pixel zone C, color filters 43a and 43b and micro-lenses 45 may be formed on the second passivation layer 41.

An image sensor according to some embodiments of inventive concepts may increase in reliability and decrease in dark current and white spot. A method of fabricating an image sensor according to some embodiments of inventive concepts may solve the problem that a photoresist pattern remains in the second pad separation trench and the pixel separation trench.

As used herein, the term "and/or" includes any and all combinations of one or more of the associated listed items. Expressions such as "at least one of," when preceding a list of elements, modify the entire list of elements and do not modify the individual elements of the list.

As described above, the embodiments have been described with reference to the drawings and the specification. Although the embodiments have been described using specific terms in the specification, these terms are used to describe the technical idea of the present disclosure but are not used to limit the meaning or limit the scope of the present disclosure in the claims. While the inventive concepts have been particularly shown and described with reference to embodiments thereof, it will be understood that various changes in form and details may be made therein without departing from the spirit and scope of the following claims.

What is claimed is:

1. An image sensor, comprising:
   a semiconductor substrate comprising a pixel zone and a pad zone, the semiconductor substrate comprising a first surface and a second surface opposing each other;
   a first pad separation pattern on the pad zone and extending from the first surface of the semiconductor substrate toward the second surface of the semiconductor substrate;
   a second pad separation pattern on the pad zone and extending from the second surface of the semiconductor substrate toward the first surface of the semiconductor substrate, the second pad separation pattern being in contact with the first pad separation pattern; and
   a pixel separation pattern on the pixel zone and extending from the second surface of the semiconductor substrate toward the first surface of the semiconductor substrate.

2. The image sensor of claim 1,
   wherein the pixel separation pattern is spaced apart from the first surface of the semiconductor substrate, and
   wherein the image sensor further comprises a pixel separation region between the pixel separation pattern and the first surface of the semiconductor substrate,
   wherein the pixel separation region is in contact with the pixel separation pattern.

3. The image sensor of claim 2, wherein a first width of the first pad separation pattern is greater than a second width of the second pad separation pattern.

4. The image sensor of claim 1, wherein a portion of the second pad separation pattern extends into the first pad separation pattern.

5. The image sensor of claim 1,
   wherein the first pad separation pattern is in a first pad separation trench adjacent to the first surface of the semiconductor substrate, and
   wherein the first pad separation pattern comprises:
      a liner insulation pattern conformally covering an internal surface of the first pad separation trench; and
      a first buried insulation pattern filling the first pad separation trench.

6. The image sensor of claim 5,
   wherein the second pad separation pattern is disposed in a second pad separation trench adjacent to the second surface of the semiconductor substrate, and
   wherein the second pad separation pattern comprises:
      a fixed charge layer conformally covering an internal surface of the second pad separation trench; and
      a second buried insulation layer filling the second pad separation trench.

7. The image sensor of claim 6, wherein the fixed charge layer and the second buried insulation layer extend to cover the second surface of the semiconductor substrate across the pixel zone and the pad zone.

8. The image sensor of claim 6,
   wherein the pixel separation pattern is disposed in a pixel separation trench adjacent to the second surface of the semiconductor substrate,
   wherein the fixed charge layer extends to conformally cover an internal surface of the pixel separation trench, and
   wherein the second buried insulation layer fills the pixel separation trench.

9. The image sensor of claim 1,
   wherein the semiconductor substrate further comprises a logic zone,
   wherein the image sensor further comprises a logic separation pattern on the logic zone and extending from the first surface of the semiconductor substrate toward the second surface of the semiconductor substrate, the logic separation pattern being spaced apart from the second surface of the semiconductor substrate, and
   wherein a first vertical distance from the second surface to the first pad separation pattern is less than a second vertical distance from the second surface to the logic separation pattern.

10. The image sensor of claim 1, further comprising:
an interlayer dielectric layer on the first surface of the semiconductor substrate;
a conductive line in the interlayer dielectric layer; and
a through via on the pad zone and penetrating the semiconductor substrate and the interlayer dielectric layer to be in contact with the conductive line,
wherein the first pad separation pattern and the second pad separation pattern surround the through via in a plan view.

11. The image sensor of claim 10,
wherein the through via is spaced apart from both the first pad separation pattern and the second pad separation pattern,
wherein the through via comprises:
a first metal layer adjacent to the semiconductor substrate; and
a second metal layer spaced apart from the semiconductor substrate.

12. The image sensor of claim 11, wherein a first electrical resistance of the first metal layer is less than a second electrical resistance of the second metal layer.

13. The image sensor of claim 1, wherein a first vertical distance from the first surface of the semiconductor substrate to the second pad separation pattern is identical to or greater than a third vertical distance from the first surface of the semiconductor substrate to the pixel separation pattern.

14. The image sensor of claim 1,
wherein the pixel zone comprises a first unit pixel, a second unit pixel, a third unit pixel, and a fourth unit pixel,
wherein the first unit pixel is adjacent to the second unit pixel in a first direction and to the fourth unit pixel in a second direction intersecting the first direction,
wherein the first to fourth unit pixels have substantially a same width parallel to the first direction,
wherein a third width of the first unit pixel parallel to the second direction is different from a fourth width of the fourth unit pixel parallel to the second direction, and
wherein a fifth width of the second unit pixel parallel to the second direction is different from a sixth width of the third unit pixel parallel to the second direction.

15. The image sensor of claim 14,
wherein the first unit pixel, the second unit pixel, the third unit pixel, and the fourth unit pixel comprise a unit pixel group, and
wherein the image sensor further comprises:
a floating diffusion region on the unit pixel group; and
an auxiliary pixel separation region between the floating diffusion region and the pixel separation pattern.

16. The image sensor of claim 14,
wherein the sixth width of the third unit pixel and the fourth width of the fourth unit pixel parallel to the second direction are greater than the third width of the first unit pixel and the fifth width of the second unit pixel parallel to the second direction, and wherein the image sensor further comprises at least one of a reset gate, a source follower gate, or a select gate that are disposed on the third and fourth unit pixels.

17. The image sensor of claim 1,
wherein a first side lower end of the second pad separation pattern laterally protrudes from the first pad separation pattern,
wherein a second side upper end of the first pad separation pattern laterally protrudes from the second pad separation pattern, and
wherein a protruding direction of the second side upper end of the first pad separation pattern is opposite to a protruding direction of the first side lower end of the second pad separation pattern.

18. An image sensor, comprising:
a semiconductor substrate comprising a pad zone and having a first surface and a second surface opposing each other;
a first pad separation pattern on the pad zone and extending from the first surface of the semiconductor substrate toward the second surface of the semiconductor substrate;
a second pad separation pattern on the pad zone and extending from the second surface of the semiconductor substrate toward the first surface of the semiconductor substrate, the second pad separation pattern being in contact with the first pad separation pattern; and
a through via on the pad zone and spaced apart from the first and second pad separation patterns, the through via penetrating the semiconductor substrate,
wherein the first pad separation pattern is disposed in a trench provided in the semiconductor substrate, the trench being adjacent to the first surface of the semiconductor substrate,
wherein the first pad separation pattern comprises:
a liner insulation pattern covering an internal surface of the trench; and
a buried insulation pattern filling the trench.

19. The image sensor of claim 18, wherein the semiconductor substrate further comprises a pixel zone,
wherein the image sensor further comprises:
a pixel separation pattern on the pixel zone and extending from the second surface of the semiconductor substrate toward the first surface of the semiconductor substrate; and
a pixel separation region between the second surface of the semiconductor substrate and the pixel separation pattern.

20. The image sensor of claim 19,
wherein each of the second pad separation pattern and the pixel separation pattern comprises both a fixed charge layer in contact with the semiconductor substrate and a buried insulation layer spaced apart from the semiconductor substrate.

* * * * *